United States Patent [19]

Plesinger et al.

[11] Patent Number: 5,061,547

[45] Date of Patent: Oct. 29, 1991

[54] STRUCTURE OF CONDUCTIVE LAYERS IN MULTILAYER SUBSTRATES FOR MINIMIZING BLISTERS AND DELAMINATIONS

[76] Inventors: Boris Plesinger, 8442 E. Hackamore Dr., Scottsdale, Ariz. 85255; Lynn H. Brown, 6702 N. 14th Pl., Phoenix, Ariz. 85020; Edward D. Pisacich, 2202 W. Joan D'Arc Ave., Phoenix, Ariz. 85029

[21] Appl. No.: 845,724

[22] Filed: Mar. 28, 1986

[51] Int. Cl.$^5$ .......................... B32B 3/26; B32B 31/00
[52] U.S. Cl. .................................... 428/209; 428/601; 428/901; 156/87
[58] Field of Search ................... 156/87; 428/209, 601, 428/901

[56] References Cited

U.S. PATENT DOCUMENTS

| | | | |
|---|---|---|---|
| 4,350,545 | 9/1982 | Garabedian | 156/87 |
| 4,489,119 | 12/1984 | Ishige et al. | 156/87 X |
| 4,522,667 | 6/1985 | Hanson et al. | 156/87 |

FOREIGN PATENT DOCUMENTS 2099742 12/1982 United Kingdom ................. 156/87

Primary Examiner—George F. Lesmes
Assistant Examiner—Chris Brown
Attorney, Agent, or Firm—James H. Phillips; John S. Solakian

[57] ABSTRACT

A multilayer substrate provides predetermined connections to and between a plurality of integrated circuit chips mounted thereon. A plurality of layers mounted on a surface of a substrate has a plurality of layers comprising a plurality of dielectric layers, a first plurality of metallic layers, and a second plurality of metallic layers. The first plurality of metallic layers has a predetermined pattern for forming the predetermined connections, these being the x-lines and y-lines. Each of the second plurality of metallic layers provides a predetermined voltage level to the integrated circuit chips, and each of the second metallic layers has a screen-like structure. Each of the first and second metallic layers is insulated from the other metallic layers by one of the dielectric layers, except for desired interconnections between the x-lines y-lines, and power layer (or power plane).

3 Claims, 2 Drawing Sheets

STRUCTURE OF CONDUCTIVE LAYERS IN MULTILAYER SUBSTRATES FOR MINIMIZING BLISTERS AND DELAMINATIONS

RELATED PATENT APPLICATION

The present patent application is related to U.S. Patent application Ser. No. 06/796,672, filed on Nov. 8, 1985, now abandoned, and Ser. No. 07/033,869, now U.S. Pat. No. 4,767,104 entitled "Non-Precious Metal Furnace With Inert Gas Firing", by Boris Plesinger, and assigned to Honeywell Information Systems Inc., the assignee of the present application.

BACKGROUND OF THE INVENTION

This invention relates to a multilayer ceramic substrate, and more particularly, to metal layers of the multilayer ceramic substrate, wherein the conductive and insulating layers of the multilayer ceramic substrate are applied as thick film pastes, and each layer after it is applied is fired to secure the layers to each other and to the ceramic substrate.

Multilayer ceramic substrates (or multilayer ceramic carriers) are used to mount and interconnect a plurality of integrated circuit chips. Each layer of a multilayer ceramic substrate may be a dielectric, or insulating layer, or a metallic or conductive layer, the pattern of each layer being predetermined such that desired interconnections between integrated circuit chips are made, and electrically isolated from undesired connections. Each layer of the multilayer ceramic substrate is produced using a thick film paste deposited on the surface of the substrate, followed by a firing in a furnace, such as the furnace described in the related patent application referred to above. As described in the related patent application, the firing of each layer of thick film paste produces gases and other undesirable residue material which are extracted during the firing process. However, sometimes not all the undesirable residual gases may be extracted during the first firing, but are subsequently released and extracted on subsequent firings. These undesirable residual gases can only escape from within the layers if the material of the newly added layer after being fired is sufficiently porous to provide paths which allow the undesirable residual gases from lower layers to escape. Since sintered metal is not sufficiently porous to allow any undesirable residual gases to penetrate through the sintered metal layer to escape, when residual gases are produced, the likelihood is high that a higher or a top layer of fired, or sintered, metal will delaminate (or blister) from the layer immediately below due to the pressure exerted by the residual gases against such a layer of sintered metal. This localized loss of adhesion of a fired metallic layer to a fired dielectric layer is a source of reliability problems and results in rejecting the substrate. This rejection is usually done late in the manufacturing process of the multilayer ceramic substrate in which the substrate has gone through many firings and included many hours of labor thereby rejecting a high cost part.

Thus, there exists a need to eliminate the blistering/delamination problem by providing a structure which allows the undersirable residual gases which are not extracted during a first firing to escape during subsequent firings.

SUMMARY OF THE INVENTION

Therefore, there is provided by the present invention a structure for a metallic layer of a multilayer ceramic substrate whereby residual undersirable gases can escape in subsequent firings and which eliminates the potential problem of delamination or localized loss of adhesion of a metallic layer to a dielectric layer. The present invention provides a multilayer ceramic substrate which provides predetermined connections to and between a plurality of integrated circuit chips mounted on the multilayer ceramic substrate. The multilayer ceramic substrate includes a ceramic substrate having a plurality of layers of fired or sintered materials mounted on a surface of the substrate. The plurality of layers comprises a plurality of fired dielectric layers, and a first plurality of fired, or sintered metallic layers. The next adjacent layer of each of a first plurality of fired metallic layers is one of the fired dielectric layers. Each of the first plurality of metallic layers has a predetermined pattern for forming the predetermined connections. The plurality of layers also comprises a second plurality of fired metallic layers, the next adjacent layer of each of the second plurality of fired metallic layers being one of the fired dielectric layers. Each of the second plurality of metallic layers has a predetermined pattern for providing a predetermined voltage level to an integrated circuit chip, and each of the second metallic layers having a screen-like structure in which the openings, or spaces, between intersecting lines of sintered conductor forming a screen, or grid, are filled with fired dielectric material.

Accordingly, it is an object of the present invention to provide a structure for a metallic layer in a multilayer substrate whereby openings in the conductive grid filled with relatively porous fired dielectric material which provides permeable areas to allow residual gases from lower layers to escape.

It is still another object of the present invention to provide a grid like structure for a fired metallic layer of a multilayer ceramic substrate whereby the spaces, or openings, between the intersecting lines of conductive material of the conductive layer provide permeable areas allowing residual gases to escape without creating a differential pressure acting on the grid causing blistering or delamination.

These and other objects of the present invention will become more apparent when taken in conjunction with the following description and attached drawings wherein like characters indicate like parts and which drawings form a part of the present application.

BRIEF DESCRIPTION OF THE DRAWINGS

FIG. 1, shows an isometric view of a multilayer substrate, of the prior art;

FIG. 2, shows an isometric view of a multilayer ceramic substrate of the preferred embodiment of the present invention.

DETAILED DESCRIPTION

Figure 1A:
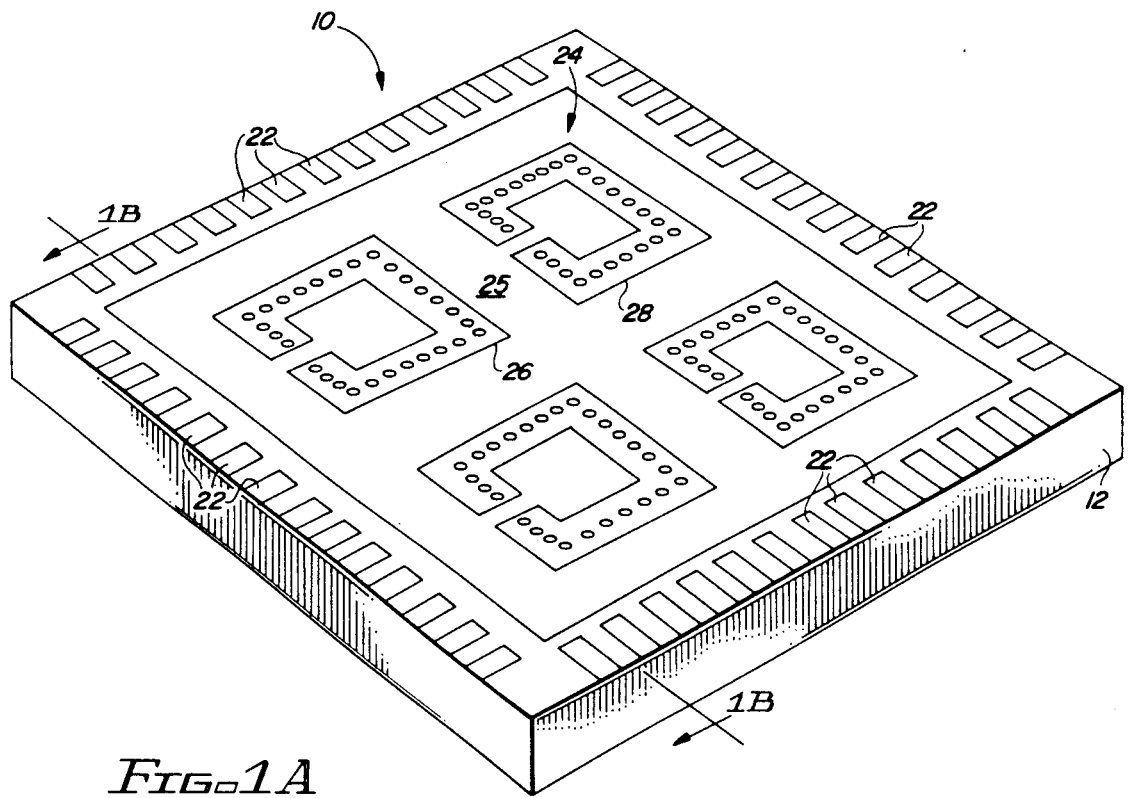
FIG. 1A, which together with FIG. 1B comprises
Figure 1B:
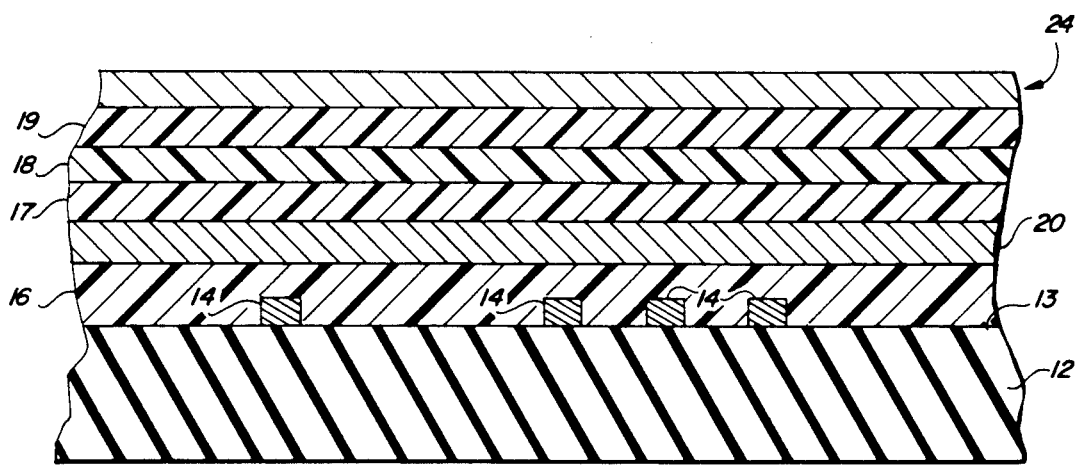
FIG. 1B is a cross-sectional view taken on line 1B—1B of the multilayer substrate of FIG. 1A.

Referring to FIGS. 1A and 1B, which taken together comprise FIG. 1, there is shown in FIG. 1A an isometric view of a multilayer ceramic substrate of the prior art having deposited thereon a plurality of fired dielectric and sintered, or fired, metallic layers, each layer having a predetermined pattern to accomplish a desired interconnection function. FIG. 1B shows a cross-sectional view 1B—1B of the multilayer substrate of FIG. 1A of the prior art. The multilayer substrate 10 includes a ceramic substrate 12. In the preferred embodiment of the present invention, a thick film metallic paste is placed on the top surface 13 of the ceramic substrate 12, the thick film metallic paste having a predetermined pattern which results in the X-lines 14 of the first layer after the firing (or curing) process, the firing processes being accomplished in a furnace, more fully described in the related patent application identified above. A layer of dielectric material 16 is then placed on the resulting surface of the ceramic substrate such that the X-lines 14 are then insulated from subsequent metallic layers placed above, or on top of, the resulting surface of the multilayer substrate after each firing. Although only one layer of fired dielectric material 16 is shown, it will be understood by those skilled in the art that multiple layers of fired dielectric material may be added to yield the desired thickness of dielectric material, thereby resulting in desired spacing between fired, or sintered, metallic layers to yield desired mechanical and electrical characteristics and properties. On top of the dielectric layer 16 the next layer of thick film metallic paste is placed having a predetermined pattern which results in Y-lines 20. Although not specifically shown, desired interconnections between preselected X-lines 14 and Y-lines 20 can be made through the use of "vias". Some of the X-lines 14 and Y-lines 20 connect to predetermined I/O pads 22 which allow signals to be inputted and outputted from the resulting circuit board of the multilayer substrate. The interconnection between the X-lines 14 and Y-lines 20, to the I/O pads 22 are not shown in FIG. 1A because a layer of fired dielectric material has since been placed over the interconnecting X-lines and Y-lines thereby hiding these lines from view.

On top of the Y-lines 20 a plurality of fired dielectric layers 17, 18, 19, have been placed, each layer having been generated by placing a layer of thick film paste of appropriate thickness on the top surface of the next lower layer and firing substrate 10 in the furnace. The third metal layer 24 is then placed on top of the last dielectric layer 19, the metallic layer 24 again being generated through the use of a thick film metallic paste which is subsequently fired in the furnace.

Figure 2A:
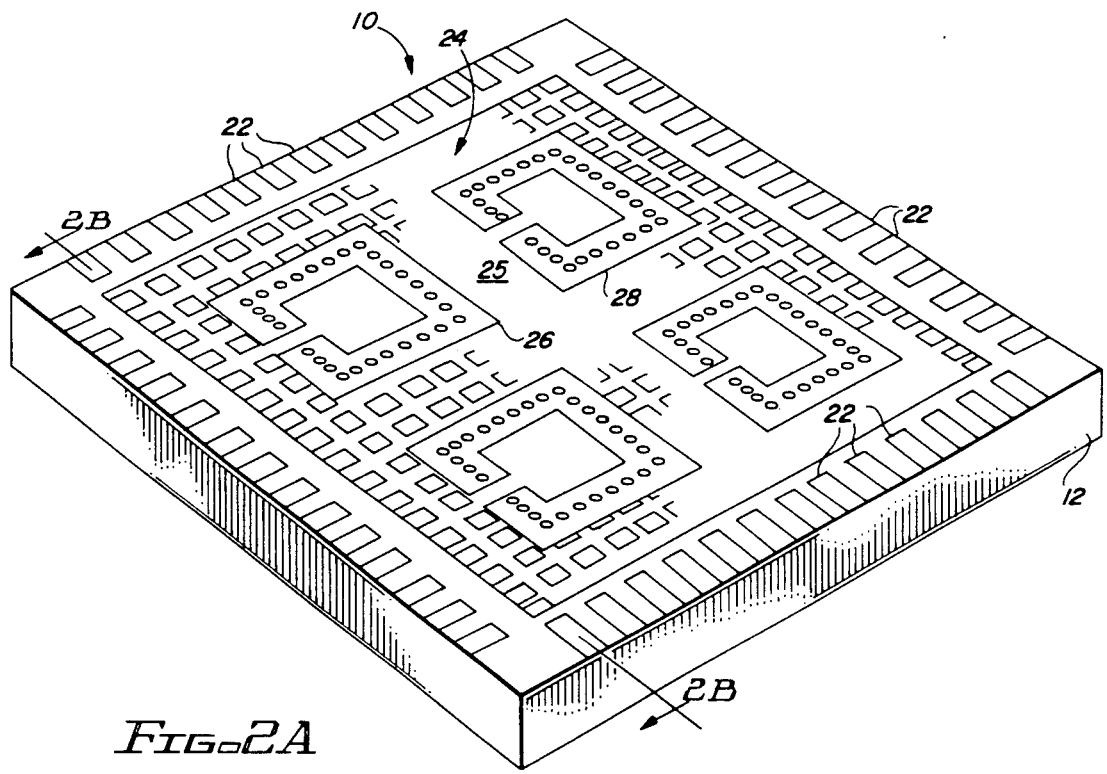
FIG. 2A, which together with FIG. 2B comprise
Figure 2B:
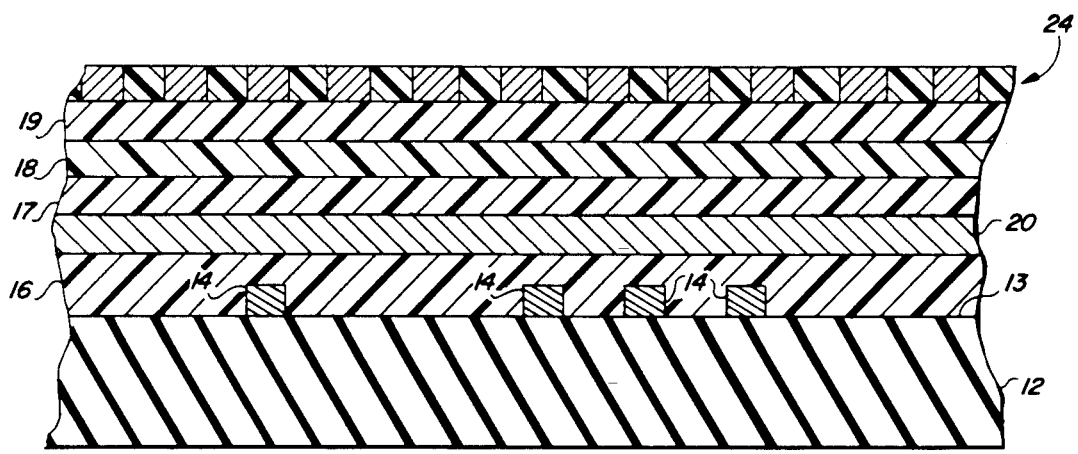
FIG. 2B is a cross-sectional view taken on line 2B—2B of the multilayer substrate of FIG. 2A.

The metallic layer 24' of the preferred embodiment of the present invention illustrated in FIGS. 2A and 2B has a pattern somewhat as shown in FIG. 1A. Although only four integrated circuit (IC) mounting positions are shown for integrated circuit chips, the preferred embodiment of the present invention includes in the order of 90-100 integrated circuit (IC) mounting positions. It will also be understood by those skilled in the art that the number of mounting positions is in no way intended to limit the scope of the invention but is merely a designer's choice, the choice being a function of the size of the integrated circuit chips (not shown), the size of the ceramic substrate 12', the function desired to be performed by the circuit board of the multilayer substrate, and other considerations.

In the preferred embodiment of the present invention, the third metallic layer 24' is a power plane, i.e., power is supplied to the metallic layer and distributed to the various terminals of the integrated circuit chips as desired. Although not shown in FIG. 2B, subsequent layers will be added above the third metallic layer 24' to provide a ground plane, and additional power planes as needed, when the various integrated circuit chips utilized require more than one voltage level. As a result, subsequent firings of the multilayer substrate 10' will be made after the firing for the third metallic layer 24'. The surface area of layer 24' between integrated circuit mounting positions 26', 28', as well as other portions of surface area of third metallic layer 24', can have dimensions of 0.250 to 0.500 inches, which if filled with, or occupied by, sintered metal as is the case with multilayer substrate 10 illustrated in FIGS. 1A and 1B is a significant area capable of blocking the escape of residual gases contained in dielectric layers 17', 18', 19', or even further underlying layers. If the gases from these lower layers are not allowed to escape, differential pressure can be created against the underside of the metallic layer, causing large areas of the metallic layer to lose adhesion, resulting in a blister or delamination of the layer.

In order to permit the escape of underlying residual gases, layer 24' is configured to have a screen-like, or grid-like, structure, thereby permitting the escape of the underlying gases. This is because the solid metal layer 24 of FIGS. 1A and 1B, after having been sintered, is not sufficiently porous to allow the escape of the underlying undesirable residual gases. By providing the screen-like or grid-like pattern for the metallic layer 24' rather than having a relatively large solid surface area as is the case with layer 24 of multilayer substrate 10 of FIG. 1, the gases released below such an area can more easily escape. Referring to FIG. 2, which comprises FIGS. 2A and 2B, the third metallic layer 24' is shown having a grid-like structure. The size of the metallic lines which make up the grid are in the five mil range, which are comparable in width to the X-lines 14' and Y-lines 20'. This gives the metallic layer 24' a porous quality which allows the underlying residual gases to escape and yet provides a power plane electrically the equivalent of the entire third metallic layer 24. By allowing the gases a path to escape, no differential pressure is generated under the metallic layer, thereby eliminating the blistering or delamination effect. Additional metallic layers (not shown) forming the additional power plane layers and the metallic layer forming the ground plane will also have the screen-like configuration.

It will be understood by those skilled in the art that many configurations of screen-like patterns may be utilized in making the metallic layer 24' porous, and further, the size of the lines which make up the "screen" of the metallic layer, only need be sufficiently thin so as not to trap undesirable residual gases.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

We claim:

1. In a multilayer ceramic substrate for providing predetermined electrical connections to and between a plurality of integrated circuit chips mounted on said substrate, said substrate including a plurality of electrical insulating layers made of a fired dielectric material and a plurality of electrical conductive layers made of a fired metallic material, areas of the fired metallic material of a given conductive layer having different sizes, the improvements comprising:

an area of larger size of the fired metallic material of a given conductive layer being formed as a grid of intersecting lines of the fired metallic material, there being spaces defined between the intersecting lines of the fired metallic material of said area; and fired dielectric material of an electrically insulating layer filling said spaces.

2. A multilayer ceramic substrate for providing predetermined connections to and between a plurality of integrated circuit chips mounted on said multilayer substrate, said multilayer substrate including a ceramic substrate having a plurality of fired layers mounted on a surface of the substrate, the plurality of layers comprising:

a) a plurality of dielectric layers made from a fired thick film dielectric paste;

b) a first plurality of metallic layers made from a first thick film metallic paste, the next adjacent layer of each of said first plurality of fired metallic layers being one of said dielectric layers, each of said first plurality of metallic layers having a predetermined pattern for providing the predetermined electrical connections;

c) a second plurality of metallic layers made from a fired thick film metallic paste, the next adjacent layer of each of said second plurality of metallic layers being one of said fired dielectric layers, each of said second plurality of fired metallic layers including intersecting lines of said fired thick film metallic paste, said lines having a predetermined pattern and defining spaces between said lines; and d) dielectric material made from a fired thick film dielectric paste substantially filling said spaces.

3. A multilayer ceramic substrate for providing predetermined connections to and between a plurality of integrated circuit chips mounted on said multilayer substrate, said multilayer substrate including a ceramic substrate having a plurality of layers of fired material mounted on a surface of the substrate, each fired layer being adjacent to the next fired layer, each layer being individually formed from thick film paste followed by a firing of the paste, the plurality of fired layers comprising:

a) a plurality of fired dielectric layers;

b) a first plurality of fired metallic layers, the next adjacent layer of each of said first plurality of fired metallic layers being one of said fired dielectric layers, each of said first plurality of fired metallic layers having a predetermined pattern for providing the predetermined connections;

c) a second plurality of fired metallic layers made from fired thick film metallic paste, the next adjacent layer of each of said second plurality of fired metallic layers being one of said fired dielectric layers, each of said second plurality of fired metallic layers have a predetermined pattern for providing electrical connections to the integrated circuit chips, each of said second fired metallic layers including a screen-like structure formed of intersecting lines of fired metallic material, said intersecting lines of fired metallic material defining spaces in said second plurality of fired metallic layers; and d) fired dielectric material filling said spaces so that undesirable residual gas from underlying layers can escape during the firing of a second metallic area and any subsequent firings, thereby eliminating blistering and delamination of said areas having a screen-like structure of said second metallic layers.

* * * * *